(12) United States Patent
Bhaskaran

(10) Patent No.: US 6,400,195 B1
(45) Date of Patent: Jun. 4, 2002

(54) METHOD AND APPARATUS FOR CONTROLLING RESET OPERATIONS

(75) Inventor: Suraj Bhaskaran, Austin, TX (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 09/642,710

(22) Filed: Aug. 21, 2000

(51) Int. Cl.[7] .............................. H03L 7/00
(52) U.S. Cl. ........................ 327/142; 327/198
(58) Field of Search ................ 327/142, 143, 327/198

(56) References Cited

U.S. PATENT DOCUMENTS 5,375,247 A * 12/1994 Hueser ...................... 713/330
5,696,979 A * 12/1997 Saitou ....................... 713/323
6,118,384 A * 9/2000 Sheldon et al. ............ 340/636

* cited by examiner

*Primary Examiner*—Terry D. Cunningham
*Assistant Examiner*—Quan Tra
(74) *Attorney, Agent, or Firm*—Williams, Morgan & Amerson

(57) ABSTRACT

A system includes a detector, a first and second processor, and a reset circuit. The detector delivers a first signal in response to detecting a preselected condition, such as low battery voltage. The first processor receives the first signal and delivers an acknowledge signal indicating that the first processor will enter a reset mode of operation in response to receiving a reset signal. The second processor enters the reset mode of operation in response to receiving the first signal. The reset circuit delivers a reset signal to the first processor in response to receiving the first signal and the acknowledge signal so that the first processor is reset when it has acknowledged that it is ready to do so.

16 Claims, 6 Drawing Sheets

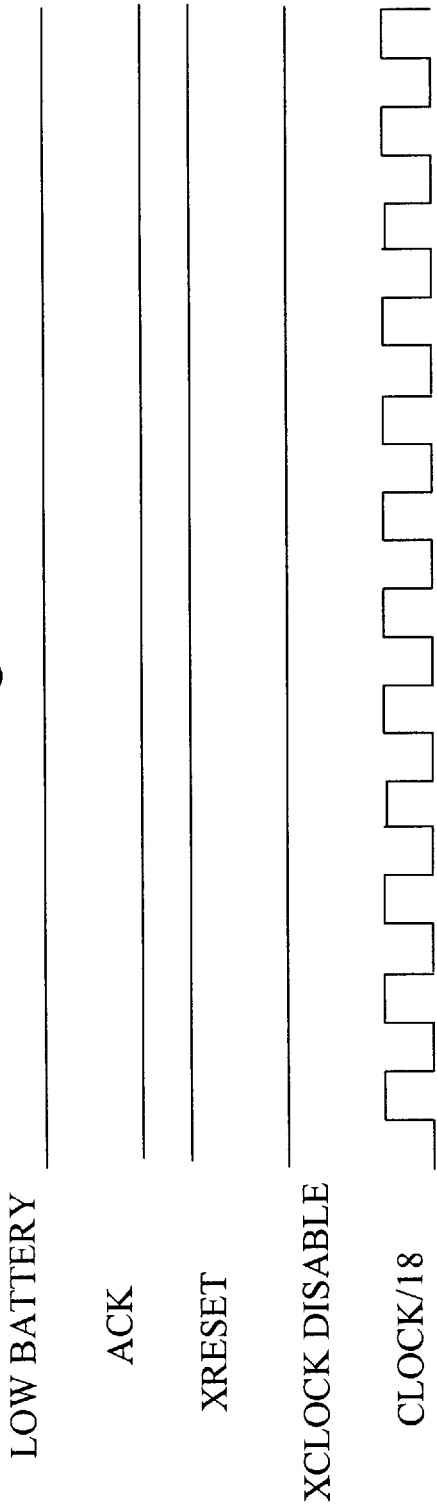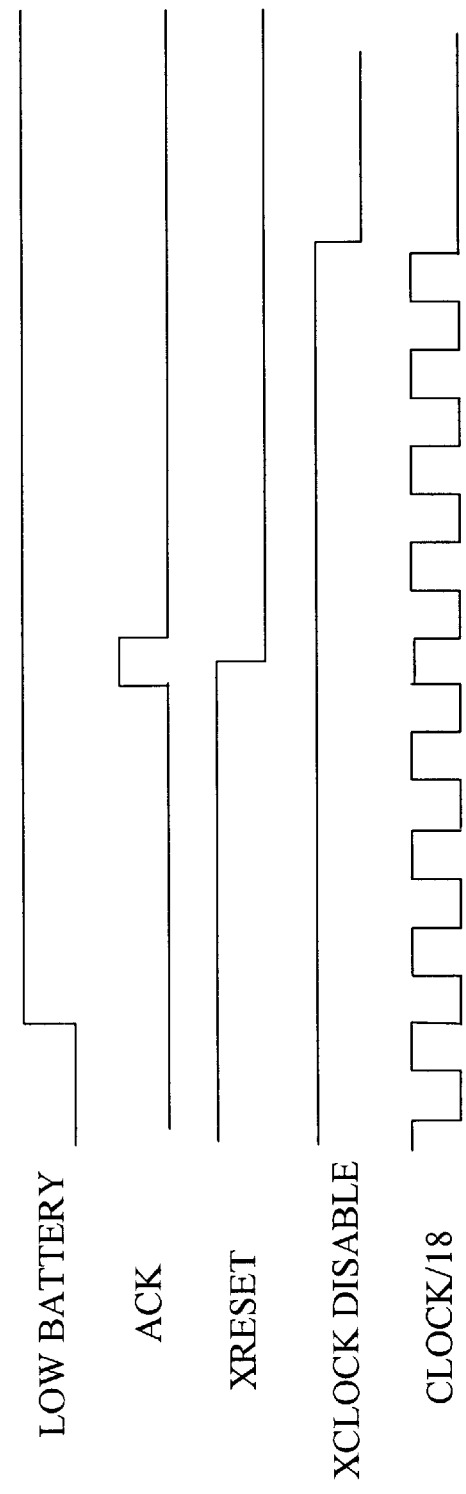

METHOD AND APPARATUS FOR CONTROLLING RESET OPERATIONS

BACKGROUND OF THE INVENTION

1. Field of the Invention

This invention relates generally to battery operated integrated circuits, and, more particularly, to reset circuits used in battery operated integrated circuits.

2. Description of the Related Art

As electronic devices have become increasingly sophisticated, a single device may employ multiple general processing units. For example, in cordless telephones that also contain voice messaging, caller identification, and other sophisticated options, multiple processors may be used, such as a microcontroller and a digital signal processor (DSP). The processors may not be arranged in a master-slave relationship, but rather, may be configured to work together to separately control different functions within the system. For example, the microcontroller may be involved in administrative tasks, whereas the DSP may control more sophisticated tasks, such as voice compression, voice recognition, voice message storage, and the like.

Since these different processors are performing functions of significantly different sophistication and priority, their response time to external, asynchronous events, such as interrupts may vary significantly. For example, an external event, such as an interrupt generated by a low-battery detection circuit, may cause the microcontroller to virtually immediately enter a reset mode without adversely impacting the operation of the telephone system, because either the microcontroller has sufficient time to complete its current task before being reset, or it is not critical that the microcontroller complete its current task. On the other hand, the DSP may not be able to complete the relatively sophisticated tasks on which it is currently working before the interrupt causes it to shut down its operation. Where the DSP is performing tasks that may be critical to its continued operation, discontinuing these tasks before they are completed may prevent the telephone system from reinitializing in its proper state after the low battery condition has been corrected. For example, the DSP may be updating or writing a serial flash device at the time of the low-battery interrupt. The data being written may be irretrievably lost if the process is interrupted.

Heretofore, electronic devices have typically responded to external, asynchronous events, such as a low battery interrupt, by forcing the device to immediately enter a low power reset mode by turning off the system clock. Thus, as discussed above, in devices where the processor is performing relatively sophisticated tasks, immediately shutting down its system clock may result in loss of data, or more significantly, may prevent the system from properly restarting when the low battery condition is corrected.

The present invention is directed to overcoming, or at least reducing the effects of, one or more of the problems set forth above.

SUMMARY OF THE INVENTION

In one aspect of the present invention, a method is provided. The method is used to control a reset operation of a device. The method includes delivering a first signal indicating that a voltage supply has fallen below a first preselected level. The device receives the first signal and delivers a second signal acknowledging that the device is prepared to enter a reset mode of operation. Thereafter, a reset signal is delivered to the device to cause the device to enter a reset mode of operation in response to receiving the first signal and the acknowledging signal.

In another aspect of the present invention, a system is provided. The system includes a detector, first and second processors, and a reset circuit. The detector is capable of delivering a first signal in response to detecting a preselected condition. The first processor is adapted to receive the first signal and deliver an acknowledge signal indicating that the first processor will enter a reset mode of operation in response to receiving a reset signal. The second processor is adapted to enter the reset mode of operation in response to receiving the first signal. The reset circuit is adapted to deliver a reset signal to the first processor in response to receiving the first signal and the acknowledge signal.

In another aspect of the present invention, an apparatus for controlling a reset operation of a device is provided. The apparatus includes a logic circuit and a timer. The logic circuit is adapted to deliver a reset signal to the device in response to receiving a low battery signal and an acknowledge signal from the device indicating that the device has received the low battery signal and is prepared to enter the reset mode of operation. The timer is adapted to deliver a clock disable signal to a system clock a preselected period of time after receiving the low battery and acknowledge signals.

In yet another aspect of the present invention, a system is provided. The system includes a detector, a reset circuit and a processor. The detector is capable of delivering a first signal in response to detecting a preselected condition. The processor is adapted to receive the first signal and deliver an acknowledge signal indicating that the first processor will enter a reset mode of operation in response to receiving a reset signal. The reset circuit is adapted to deliver a reset signal to the processor in response to receiving the first signal and the acknowledge signal.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 5A–5C illustrate timing diagrams for select portions of the circuit illustrated in FIG. 4.

Figure 1:
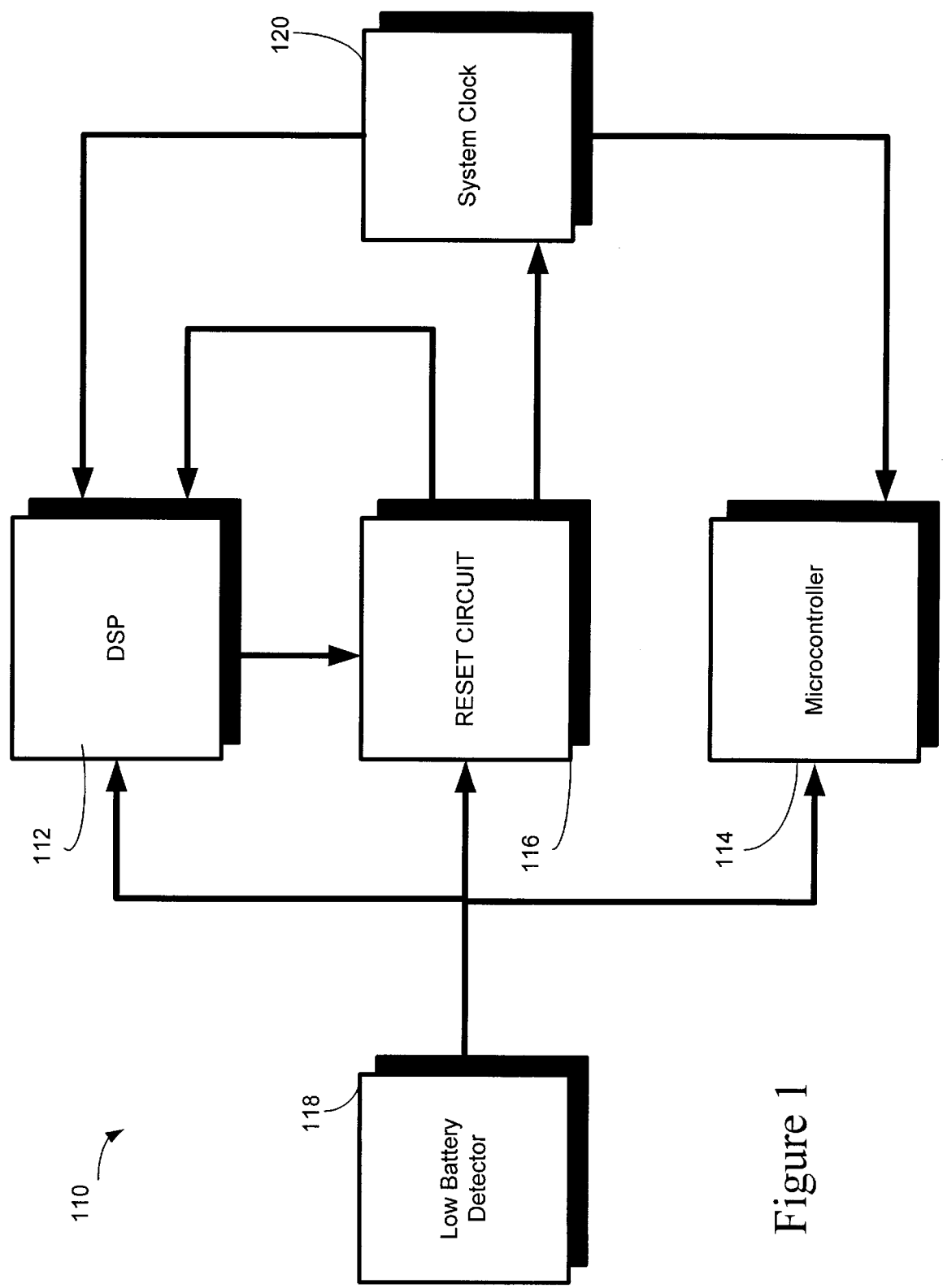
FIG. 1 illustrates a block diagram of one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a block diagram of one illustrative embodiment of the instant invention is illustrated. A system 110 is shown with two processors 112, 114, such as a DSP 112 and a microcontroller 114. In one embodiment, the system 110 is a portion of a control system within a cordless telephone (not shown) that has a plurality of features, such as voice messaging, caller identification, paging, and the like. The processors 112, 114 cooperate and interact to provide basic telephone service along with each of these features.

A reset circuit 116 is included to assist in signaling the DSP 112 to transition into a low power, standby state in response to an asynchronous, external event, such as low battery voltage. Low battery voltage is monitored by a low battery detector 118, which provides a signal indicative of the battery voltage falling below a preselected level. The low battery signal is delivered to the reset circuit 116, the DSP 112, and the microcontroller 114. The DSP 112, however, does not immediately begin a reset operation, but rather, begins preparation for an impending reset operation by entering into a mode in which housekeeping operations are performed. That is, the DSP 112 examines the operations it is currently performing, and continues those of a critical nature. After the operations are complete, the DSP 112 delivers an acknowledge signal to the reset circuit 116. The acknowledge signal indicates that the DSP 112 is now ready to enter the reset mode. Accordingly, the reset circuit 116, in response to receiving both the low battery signal and the acknowledge signal from the DSP, delivers a reset signal to at least the DSP 112, causing at least the DSP 112 to enter a reset mode of operation.

A preselected period of time after delivering the reset signal, the reset circuit 116 sends a disable signal to a system clock 120. Ordinarily, the system clock 120 delivers a clock signal of a preselected frequency to both the DSP 112 and the microcontroller 114, as well as other components of the system 110. When disabled, however, the clock signal is no longer delivered, causing both the DSP 112 and the microcontroller 114 to cease all operation and enter unto the lowest power state possible, while in reset. The timing of the delivery of the disable signal relative to the reset signal is a function of a variety of design considerations, including how long it takes for the DSP 112 to complete its reset mode of operation. That is, the period of time is selected to insure that the DSP 112 finishes all tasks in the reset mode of operation before the clock signal is disabled.

In one embodiment, the microcontroller 114 may respond to the low battery signal from the low battery detector 118 by immediately entering into a reset mode of operation. In an alternative embodiment, the microcontroller 114 may respond to the low battery signal, like the DSP 112, by preparing for an impending reset operation. In this alternative embodiment, it may be useful to also deliver the reset signal from the reset circuit 116 to the microcontroller 114 to cause the microcontroller 116 to also enter a reset mode of operation. Additionally, the alternative embodiment may benefit from an acknowledge signal from the microcontroller 114 also being delivered to the reset circuit 116. Where multiple acknowledge signals are delivered, by for example the DSP 112 and microcontroller 114, delivery of the reset signal by the reset circuit 116 may be delayed until receipt of each of these acknowledge signals.

Figure 2:
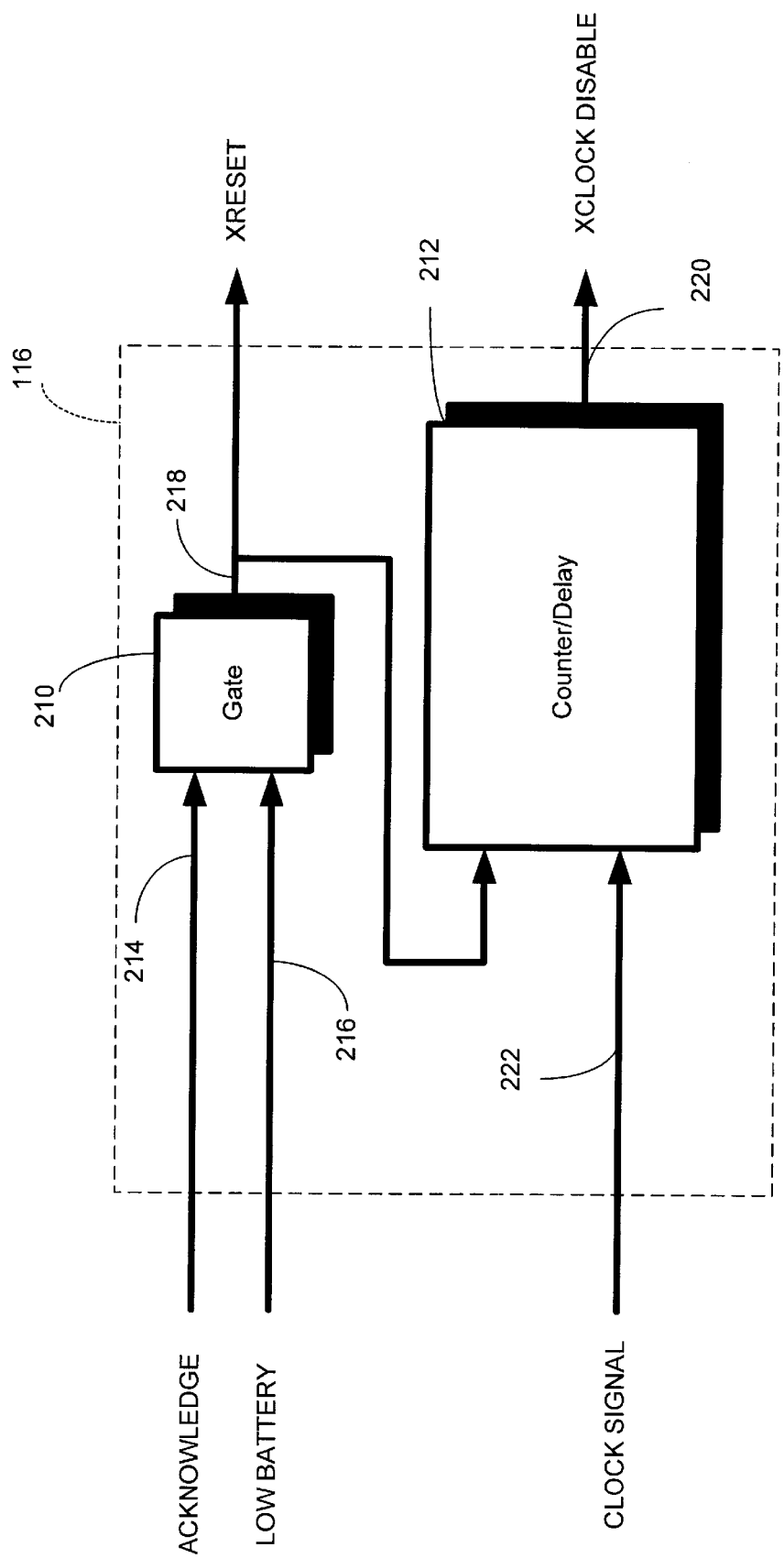
FIG. 2 illustrates a block diagram of one embodiment of a reset circuit of FIG. 1.

FIG. 2 illustrates a stylized block diagram of one embodiment of the reset circuit 116 of FIG. 1. The reset circuit 116 includes a gate 210 and a counter/delay circuit 212. The gate 210 is configured to receive both the acknowledge signal from the DSP 112 over a line 214 and the low battery signal from the low battery detector 118 over a line 216. The gate 210 operates to deliver a reset signal in response to both the acknowledge signal on the line 214 and the low battery signal on the line 216 being asserted.

The gate 210 also delivers the reset signal over a line 218 to the counter/delay circuit 212. The counter/delay circuit 212 delivers a clock disable signal over a line 220 to the system clock 120 after a pre-selected period of time. That is, the counter/delay circuit 212 shuts off the system clock 120 so that it is not delivered to the DSP 112 or the microcontroller 114 a pre-selected period of time after delivering the reset signal over the line 218 to the DSP 112. The DSP 112 is first effectively "warned" of the impending reset and subsequent disablement of the system clock, and a preselected period of time after the DSP acknowledges this "warning" interrupt signal, the system clock is actually disabled. The counter/delay circuit 212 receives a clock signal over a line 222, and after receiving a pre-selected number of clock signals, passes the reset signal on line 218 to the line 220 to disable the system clock 120.

Figure 3A:
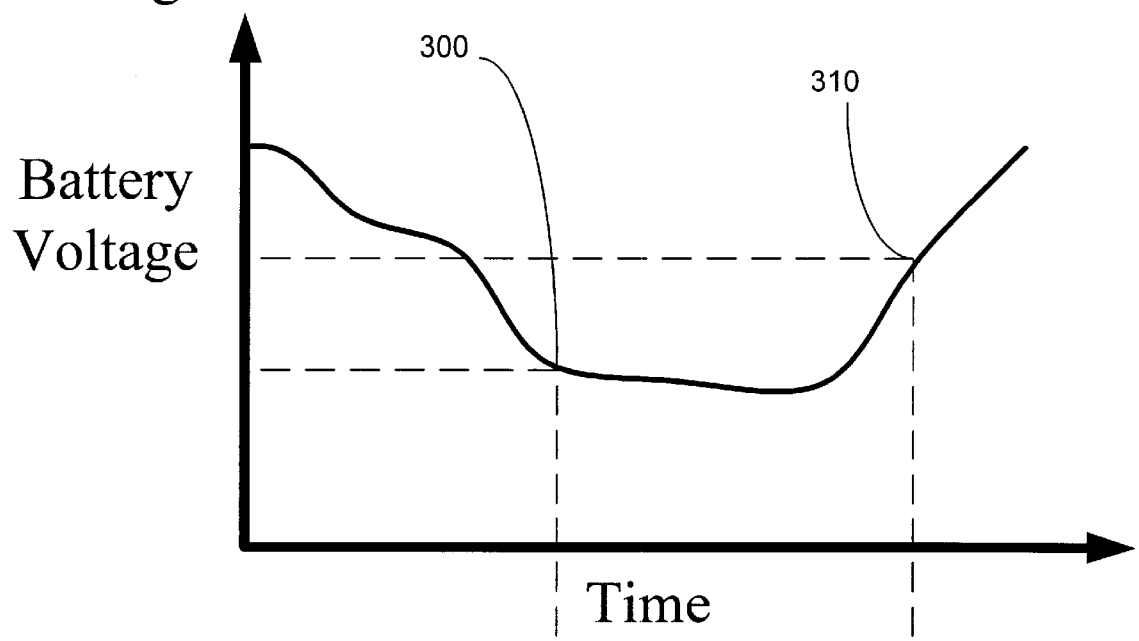
FIGS. 3A and 3B illustrate a timing diagram for a low battery detector of FIG. 1.
Figure 3B:
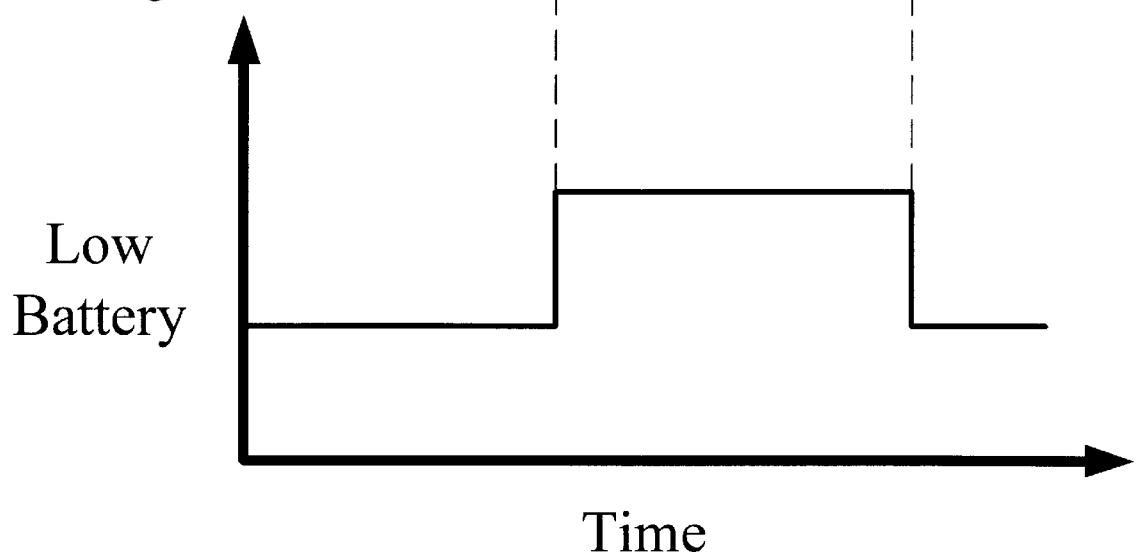

The low battery detector 118 operates to monitor battery voltage and provide an indication of when the battery voltage falls below a preselected level. A detailed circuit diagram of the battery voltage detector 118 is not included herein to avoid unnecessarily obscuring the invention, as the design is well within the capabilities of a person of ordinary skill in the art. Rather, the operation of the low battery voltage detector 118 is described with respect to the waveforms of FIGS. 3A and 3B. FIG. 3A shows a chart of battery voltage versus time, indicating that the battery voltage has fluctuated from a relatively high level to a relatively low level and back to a relatively high level. The battery voltage detector 118 monitors the battery voltage to provide an indication of when it falls below a preselected level, indicated by element number 300 in FIG. 3A. As the battery voltage falls below the preselected level 300, the low battery detector 118 delivers the low battery signal, which transitions to a logically high level, as shown in FIG. 3B. The output signal of the low battery detector 118, low battery, remains high as long as the battery voltage stays below a second preselected voltage level, as indicated by element 310 in FIG. 3A. Once the battery voltage rises above the second preselected level 310, the low battery detector 118 transitions the low battery signal from a logically high level to a logically low level, as shown in FIG. 3B. The first and second preselected voltage levels 300, 310 are selected such that the second preselected voltage level 310 is higher than the first preselected voltage level 300. This difference is often referred to as hysteresis, and is useful in reducing the likelihood that the low battery detector 118 will enter an unstable, oscillating mode, to also ensure that the low battery signal does not revert back to a logically low level until the battery is recharged.

Figure 4:
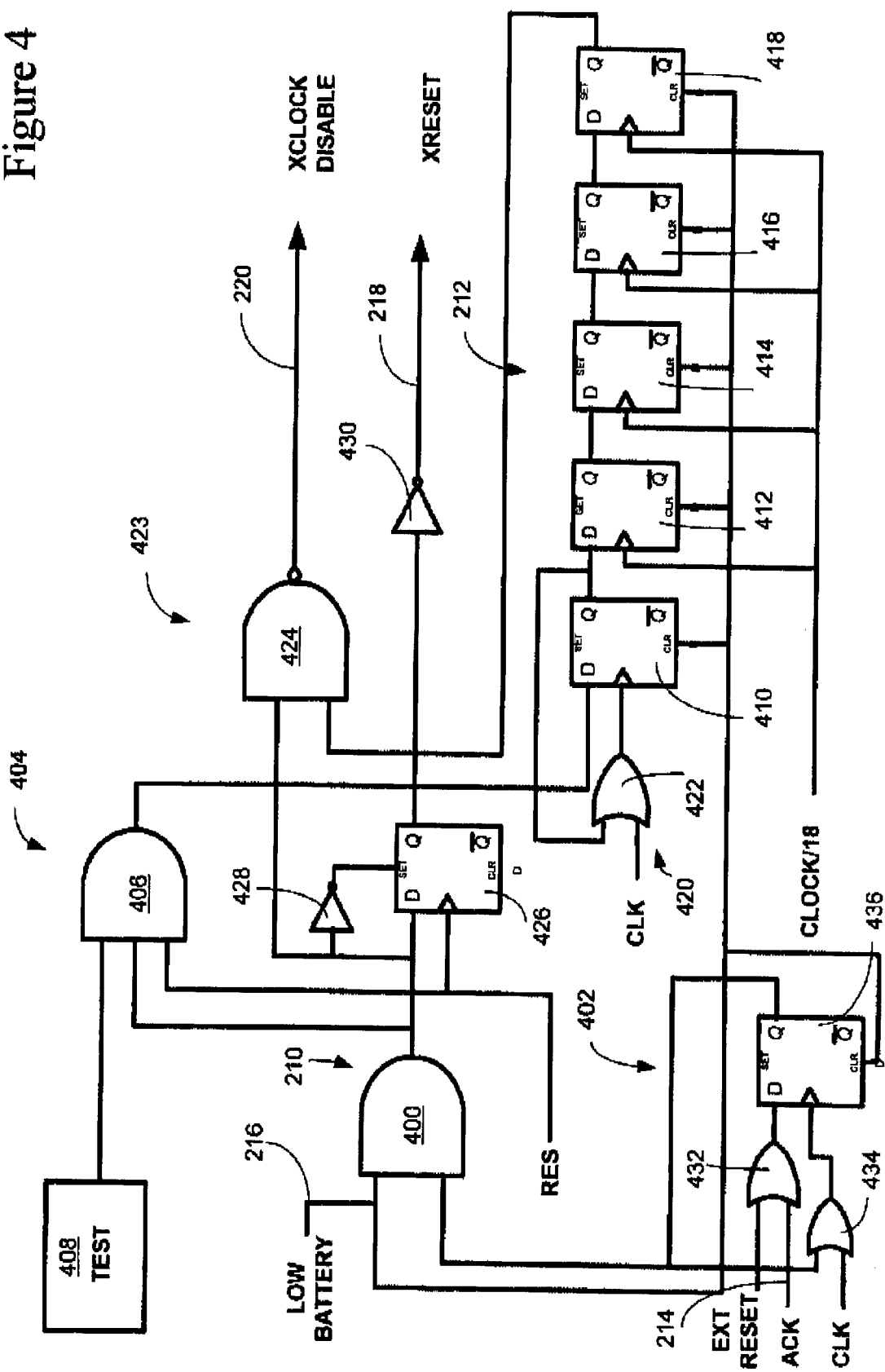
FIG. 4 illustrates an electrical schematic of one embodiment of the reset circuit of FIGS. 1 and 2.

Turning now to FIG. 4, one embodiment of an electrical schematic of at least a portion of the reset circuit 116 of FIGS. 1 and 2 is shown. The gate 210, such as a two-input terminal AND gate 400, has a first and second input terminal. The first input terminal of the AND gate 400 is coupled to receive the low battery signal from the low battery detector 118 over the line 216. The second input terminal of the AND gate 400 is coupled to an output terminal of a control circuit 402, which is described in greater detail below. The AND gate 400 has an output terminal that is connected to a first input terminal of a logic gate 404, such as a 3-input terminal AND gate 406. A second input terminal of the AND gate 406 is coupled to a test circuit 408, and a third input terminal of the AND gate 406 is coupled to receive a RES signal. An output terminal of the AND gate 406 is coupled to the counter/delay circuit 212.

In the exemplary illustrated embodiment, the counter/delay circuit 212 is comprised of a plurality of serially coupled flip-flops, such as D flip flops 410, 412, 414, 416, 418. Each of the D flip flops 410, 412, 414, 416, 418 has a clear signal input coupled to receive the low battery signal over the line 216. Additionally, each of the D flip flops 410, 412, 414, 416, 418 has a clock signal input, with the clock signal inputs for the D flip flops 412, 414, 416, 418 being coupled to receive a clock signal, clock/18, which is a system clock signal that has been slowed substantially, such as by a factor of about 18. The clock signal input for the D flip flop 410 is coupled to an output terminal of a logic gate 420, such as a two-input terminal OR gate 422. A first input of the OR gate 422 is coupled to receive a system clock signal, CLK. A second input of the OR gate 422 is coupled to an output terminal of the D flip-flop 410.

The output terminal of the final D flip flop 418 is coupled to a logic gate 423, such as a first input terminal of a two-input terminal NAND gate 424. A second input terminal of the NAND gate 424 is coupled to the output terminal of the AND gate 400. The output terminal of the NAND gate 424 is coupled to deliver the XCLOCK DISABLE signal to the system clock 120 over the line 220.

The output terminal of the AND gate 400 is also coupled to a flip-flop, such as a D flip flop 426. A clock input terminal of the D flip flop 426 is coupled to receive the RES signal. A set input terminal of the D flip flop 426 is coupled through an inverter 428 to the output terminal of the AND gate 400. An output terminal of the D flip flop 426 is coupled through an inverter 430 to deliver the XRESET signal to the DSP 112 over the line 218.

The control circuit 402 includes a pair of two-input terminal OR gates 432, 434. The first OR gate 432 has its input terminals coupled to receive a XRESET signal and the ACKNOWLEDGE signal from the DSP 112 over the line 214. The output terminal of the first OR gate 432 is coupled to an input terminal of a D flip-flop 436. The output terminal of the D flip flop 436 is coupled to a first input terminal of the OR gate 434 and to the second input terminal of the AND gate 400. The output terminal of the OR gate 434 is coupled to the clock input terminal of the D flip-flop 436.

Figure 5C:
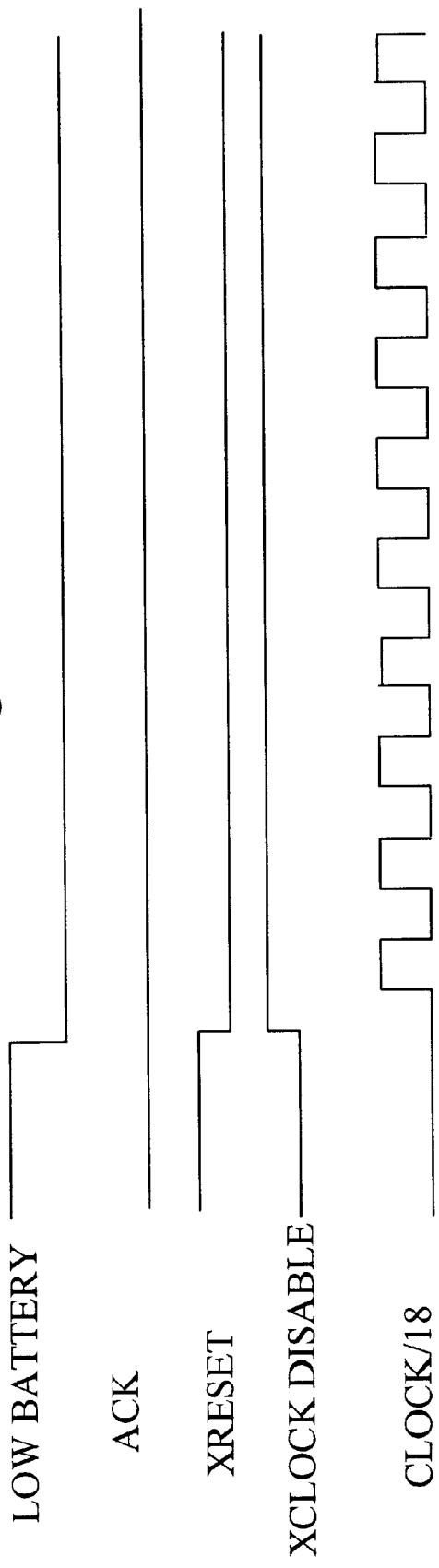

Operation of the Reset circuit 116 may be understood by reference to FIG. 4 in conjunction with the waveforms of FIGS. 5A–5C. Referring first to FIGS. 5A and 4, operation of the reset circuit 116 begins with an initial set of conditions, that include neither the DSP 112 or microcontroller 114 currently being in a reset mode of operation, nor preparing to enter a reset mode of operation, and that the battery voltage has not yet fallen below the first preselected voltage level 300. Further, it is also assumed that the system 110 has not been requested to enter a reset mode of operation, such as by an external reset switch (not shown).

Thus, as shown in FIG. 5A, the LOW BATTERY signal is at a logically low voltage level, causing the AND gate 400 to deliver a logically low signal. The logically low signal from the AND gate 400 is passed through the counter/delay circuit 212 to the NAND gate 424. The logically low signal from the AND gate 400 is also delivered to the NAND gate 424. Since both input signals to the NAND gate 424 are logically low, its output signal is logically high, which causes the system clock 120 to continue to deliver the clock signal to the DSP 112 and the microcontroller 114. Additionally, the logically low signal from the AND gate 400 is also delivered to the input of the D flip flop 426, which is passed through the inverter 430 as the RESET signal. Thus, the RESET signal, when a reset operation is not being requested, is ordinarily a logically high level.

Assuming now that the battery voltage falls below the preselected level 300, as shown in FIG. 5B, the low battery detector 118 causes the LOW BATTERY signal to transition to a logically high level, which is communicated to the DSP 112, the microcontroller 114, and the reset circuit 116. The output of the AND gate 400, however, remains at a logically low level because its second input terminal remains at a logically low level. The DSP 112, after it completes its preparation to enter the reset mode of operation, delivers the acknowledge (ACK) signal, in the form of a relatively short duration logically high pulse. The ACK signal is passed through the OR gate 432 to the D flip flop 436, which causes the output signal of the D flip flop 436 to also transition to a logically high level. The logically high level at the output terminal of the D flip flop 436 is used to latch the output terminal of the D flip flop 436 at the logically high level by passing it through the OR gate 434 to the clock input terminal of the D flip flop 436. That is, even though the duration of the ACK signal is relatively short, the logic circuit 402 responds by delivering a signal that remains logically high until the LOW BATTERY signal returns to a logically low level. Because the LOW BATTERY signal is coupled to the clear input of the D flip flop 436, the output signal of the D flip flop 436 will be forced to a logically low level when the LOW BATTERY signal transitions to a logically low level.

With both input terminals of the AND gate 400 at the logically high level, the output terminal of the AND gate 400 is forced to a logically high level. Accordingly, the D flip flop 426 passes the logically high signal to the inverter 430, which causes the RESET signal to transition to a logically low level. The logically low RESET signal is delivered to the DSP 112, causing the DSP 112 to enter the reset mode of operation.

The system clock signal, however, is not immediately disabled. Rather, a preselected period of time after the RESET signal is asserted, the system clock signal is disabled. This period of time is selected by the counter/delay circuit 212. The logically high signal at the output terminal of the AND gate 400 is passed through the AND gate 406 to the counter/delay circuit 212. At each transition of the CLOCK/18 signal, the logically high signal at the output terminal of the AND gate 406 is sequentially passed through each of the serially coupled D flip-flops 410–418. Thus, in the illustrated embodiment, after five CLOCK/18 signal transitions, the logically high signal delivered by the AND gate 400 arrives at the NAND gate 424. Since both input terminals of the NAND gate 424 are at logically high level, the output signal of the NAND gate 424 is at a logically low level, causing the clock signal to be disabled.

The status of the various signals remains as described until such time as the battery voltage rises above the preselected level 310, as shown in FIG. 5C, the low battery detector 118 causes the LOW BATTERY signal to transition to a logically low level. The logically low LOW BATTERY signal causes at least two things to happen. The D flip flop 436 is reset, and the AND gate 400 is driven to a logically low level. The logically low level signal at the output terminal of the AND gate 400 forces the RESET signal to a logically low level and the XCLOCK DISABLE signal to a logically high level, their unasserted states. Thus, the system clock 120 returns to normal operation, as does the DSP 112 and microcontroller 114.

Referring now to the test circuit 408 of FIG. 4, it may be useful to prevent the XCLOCK DISABLE signal from being delivered to the system clock 120 when testing of the circuitry is underway. That is, as long as the test circuit 408 delivers a logically low level signal to the AND gate 406, the counter/delay circuit 212 will not deliver an enabling signal to the NAND gate 424. Thus, even though the low battery detector 118 has detected a low battery condition, the system clock 120 will not be disabled as long as the test circuit 406 continues to deliver a logically low-level signal.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling a reset operation of a device, comprising:

delivering a first signal indicating that a voltage supply has fallen below a first preselected level;

receiving said first signal and delivering a second signal acknowledging that said device is prepared to enter a reset mode of operation;

delivering a reset signal to cause said device to enter the reset mode of operation in response to receiving the first signal and the acknowledging signal; and disabling a system clock coupled to said device in response to receiving the first signal and the acknowledging signal.

2. A method, as set forth in claim 1, wherein disabling the system clock comprises disabling the system clock a preselected period of time after receiving the first signal and the acknowledging signal.

3. A method, as set forth in claim 1, wherein disabling the system clock comprises disabling the system clock after the device completes the reset mode of operation.

4. A method for controlling a reset operation of a device, comprising:

delivering a first signal indicating that a voltage supply has fallen below a first preselected level;

receiving said first signal and delivering a second signal acknowledging that said device is prepared to enter a reset mode of operation;

delivering a reset signal to cause said device to enter the reset mode of operation in response to receiving the first signal and the acknowledging signal; and preventing said system clock from being disabled during a test mode.

5. A method for controlling a reset operation of a device, comprising:

delivering a first signal indicating that a voltage supply has fallen below a first preselected level;

receiving said first signal and delivering a second signal acknowledging that said device is prepared to enter a reset mode of operation;

delivering a reset signal to cause said device to enter the reset mode of operation in response to receiving the first signal and the acknowledging signal; and discontinuing delivery of said first signal in response to the voltage supply rising above a second preselected level, said second preselected level being greater than said first preselected level.

6. An apparatus for controlling a reset operation of a device, comprising: a logic circuit adapted to deliver a reset signal to said device in response to receiving a low battery signal and an acknowledge signal from said device indicating that the device has received the low battery signal and is prepared to enter the reset mode of operation; and a timer adapted to deliver a clock disable signal to a system clock a preselected period of time after receiving the low battery and acknowledge signals.

7. A system, comprising:

a detector capable of delivering a first signal in response to a detecting a preselected condition;

first processor adapted to receive said first signal and deliver an acknowledge signal indicating that said first processor will enter a reset mode of operation in response to receiving a reset signal;

a second processor adapted to enter said reset mode of operation in response to receiving said first signal; and a reset circuit adapted to deliver the reset signal to said first processor in response to receiving said first signal and said acknowledge signal.

8. A system, as set forth in claim 7, wherein said detector is adapted to deliver said first signal in response to detecting a supply voltage falling below a first preselected level.

9. A system, as set forth in claim 8, wherein said detector discontinues delivering said first signal in response to detecting the supply voltage rising above a second preselected level, said second preselected level being greater than said first preselected level.

10. A system, as set forth in claim 7, further comprising a system clock adapted to provide a clock signal to at least said first and second processors, and wherein said reset circuit is capable of delivering a disable signal to prevent said clock signal from being received by said first and second processors.

11. A system, as set forth in claim 10, wherein said reset circuit delivers said disable signal a preselected period of time after receiving said first signal and said acknowledge signal.

12. A system, as set forth in claim 10, wherein said reset circuit delivers said disable signal after the first processor completes the reset mode of operation.

13. A system, comprising:

a detector capable of delivering a first signal in response to a detecting a supply voltage falling below a first preselected level, wherein said detector discontinues delivering said first signal in response to detecting the supply voltage rising above a second preselected level, said second preselected level being greater than said first preselected level;

a processor adapted to receive said first signal and deliver an acknowledge signal indicating that said first processor will enter a reset mode of operation in response to receiving a reset signal; and a reset circuit adapted to deliver the reset signal to said processor in response to receiving said first signal and said acknowledge signal.

14. A system, comprising:

a detector capable of delivering a first signal in response to a detecting a preselected condition;

a processor adapted to receive said first signal and deliver an acknowledge signal indicating that said first processor will enter a reset mode of operation in response to receiving a reset signal;

a reset circuit adapted to deliver a reset signal to said processor in response to receiving said first signal and said acknowledge signal; and a system clock adapted to provide a clock signal to at least said processor, and wherein said reset circuit is capable of delivering a disable signal to prevent said clock signal from being received by said first processor.

15. A system, as set forth in claim 14, wherein said reset circuit delivers said disable signal a preselected period of time after receiving said first signal and said acknowledge signal.

16. A system, as set forth in claim 14, wherein said reset circuit delivers said disable signal after the processor completes the reset mode of operation.

* * * * *